(12) United States Patent
Baudry et al.

(10) Patent No.: US 8,442,326 B2
(45) Date of Patent: May 14, 2013

(54) SIGNATURE BASED REGISTRATION METHOD AND METHOD FOR SIGNATURE CALCULATION

(75) Inventors: Severine Baudry, Rennes (FR);
Bertrand Chupeau, Rennes (FR);
Frederic Lefebvre, Rennes (FR)

(73) Assignee: Thomson Licensing, Boulogne-Billancourt (FR)

( * ) Notice: Subject to any disclaimer, the term of this patent is extended or adjusted under 35 U.S.C. 154(b) by 417 days.

(21) Appl. No.: 12/807,779

(22) Filed: Sep. 14, 2010

(65) Prior Publication Data

US 2011/0064265 A1 Mar. 17, 2011

(30) Foreign Application Priority Data

Sep. 14, 2009 (FR) ..................................... 09 56302

(51) Int. Cl.
*G06K 9/64* (2006.01)
(52) U.S. Cl.
USPC .......................................... 382/217; 382/181
(58) Field of Classification Search .................. 382/115, 382/116, 181, 231, 217, 119, 123
See application file for complete search history.

(56) References Cited

U.S. PATENT DOCUMENTS

| | | | |
|---|---|---|---|
| 2006/0195860 A1* | 8/2006 | Eldering et al. | 725/19 |
| 2009/0154806 A1* | 6/2009 | Chang et al. | 382/173 |
| 2009/0324100 A1* | 12/2009 | Kletter et al. | 382/217 |

OTHER PUBLICATIONS

Massoudi et al., "A Video Fingerprint Based on Visual Digest and Local Fingerprints", ICIP 2006, Rennes, France, 2006.
Chupeau et al., "Temporal Video Registration for Watermark Detection", ICASSP 2006, Cesson-Sevigne, France, 2006.
Search Report Apr. 8, 2010.

* cited by examiner

*Primary Examiner* — Edward Park
(74) *Attorney, Agent, or Firm* — Robert D. Shedd; Robert B. Levy

(57) ABSTRACT

A method for temporal registration of a first sequence of images and a second sequence of second images is described. The method comprises the following steps for:

Figure 1:
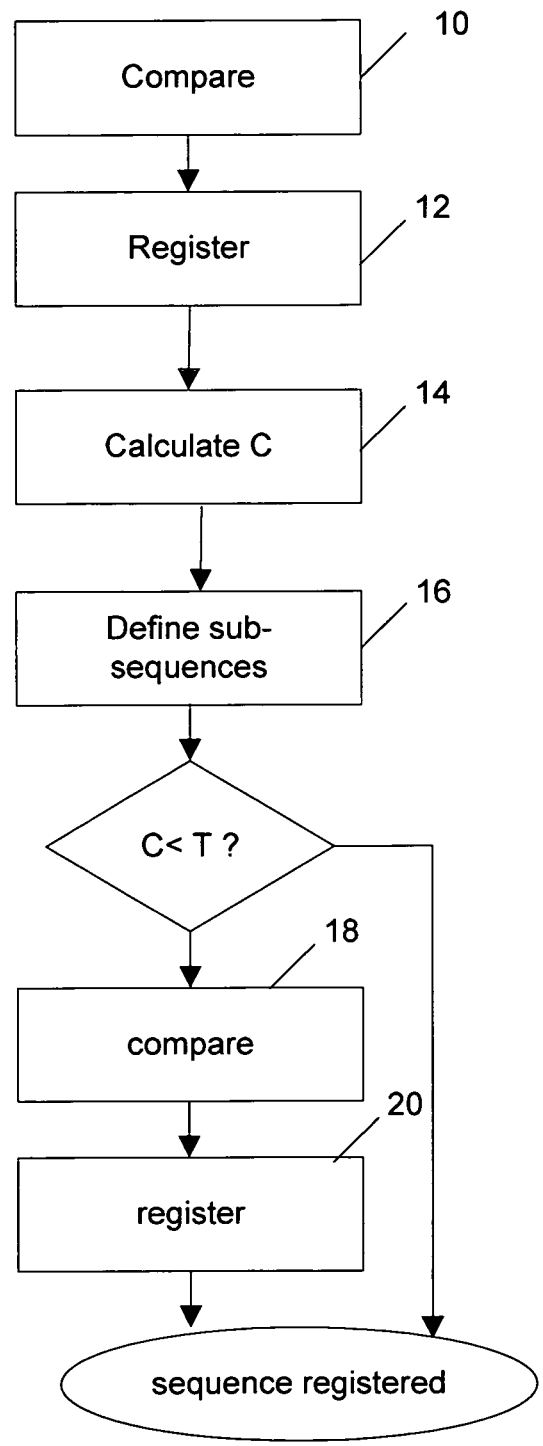

a) comparing the first parts of signatures of first images with corresponding parts of signatures of second images,
b) temporally registering each first image with one of the second images according to the result of the comparison,
c) calculating for each first image a value of quality representative of the quality of its registration,
d) defining, for each first image for which the quality value is less than a threshold, a first sub-sequence from the first sequence and a second sub-sequence from the second sequence,
e) comparing, for each first sub-sequence, second parts of signatures of first images of the first sub-sequence with corresponding parts of signatures of second images of the second corresponding sub-sequence, and
b) temporally registering each first image of the first sub-sequence with one of the second images of the second sub-sequence according to the result of the comparison.

12 Claims, 4 Drawing Sheets

SIGNATURE BASED REGISTRATION METHOD AND METHOD FOR SIGNATURE CALCULATION

This application claims the benefit, under 35 U.S.C. §119, of European Patent Application No. 0956302 of 14 Sep. 2009

1. SCOPE OF THE INVENTION

The invention relates to the general domain of image registration.

The invention relates more specifically to a method for registration of images of a first sequence with images of a second sequence from signatures associated with these images and a method for signature calculation for these images with a view to registering them.

2. PRIOR ART

To temporally register two image sequences it is known in the art to compare the signatures associated with these images. The signatures are determined from the content of the images. The bigger the signature size, the more the registration is precise in particular for images belonging to sequences with low level motion. To be precise such registration methods thus require a lot of memory space to store the signatures and also a lot of calculation time to compare the signatures.

3. SUMMARY OF THE INVENTION

The purpose of the invention is to overcome at least one of the disadvantages of the prior art. For this purpose, the invention relates to a method for temporal registration of a first sequence of first images and a second sequence of second images, a signature being associated with each of the first and second images. The method for temporal registration comprises the following steps for:
a) comparing first parts of signatures of the first images with corresponding parts of signatures of second images, called the first comparison step,
b) temporally registering each first image of the first sequence with one of the second images according to the result of the first comparison step,
c) calculating for each first image a value representative of the registration quality of the first image,
d) defining, for each first image for which the representative value of the registration quality is less than a threshold, a first sub-sequence comprising the first image and images of the first sequence temporally surrounding the first image and a second sub-sequence comprising the second image with which the first image is registered and images of the second sequence temporally surrounding the second image,
e) comparing, for each first sub-sequence, second parts of signatures of first images of the first sub-sequence with corresponding parts of signatures of second images of the second corresponding sub-sequence, called the second comparison step, the second parts of signatures being different from first parts of signatures, and
b) temporally registering each first image of the first sub-sequence with one of the second images of the second sub-sequence according to the result of the second comparison step.

The method for registration according to the invention advantageously enables the images of the first sequence to be precisely registered with the images of the second sequence while limiting the memory required. It also limits the calculation cost. The comparison of the totality of a signature with the totality of other signatures is carried out only rarely.

According to a particular aspect of the invention, the steps c) to f) are reiterated with other parts of first signatures and corresponding parts of second signatures until for each first image of the first sequence the value representative of the quality of registration of the first image is greater than the threshold.

According to a particular characteristic of the invention, the second parts comprise the first parts.

According to another particular characteristic of the invention, the second parts and the first parts are disjointed.

According to a particular characteristic of the invention, the first parts comprise low frequency wavelet coefficients and the second parts comprise high frequency wavelet coefficients.

According to a particular characteristic of the invention, the signatures comprise wavelet coefficients and for at least one of the first and second sequences, the wavelet coefficients are coded. In this case, the method for registration comprises, in addition, before each of the comparison steps, a step of decoding signature parts, the comparison steps being applied on the decoded signature parts.

The invention also relates to a method for calculation of signatures for images of a sequence of images with a view to registering the sequence with another sequence of images. The method for calculation of signatures comprises for a current image of the sequence the following steps for:
  determining a difference image pixel by pixel between the current image and one of the images temporally surrounding the current image,
  transforming the difference image into wavelet coefficients, and
  coding hierarchically at least one part of the wavelet coefficients.

According to a particular characteristic of the invention, the at least one part of the wavelet coefficients is defined in such a way that an energy value of wavelet coefficients of the at least one part is greater than a threshold value.

According to a particular characteristic of the invention, the at least one part of the wavelet coefficients is defined in such a way that an entropy value of wavelet coefficients of the at least one part is greater than a threshold value.

Advantageously, the progressive coding step implements one of the coding methods belonging to a set of progressive coding methods comprising:
  the coding method SPIHT, and
  the coding method EZW.

According to a particular characteristic of the invention, the energy value is defined as being the sum of squares of wavelet coefficients of the at least one part.

According to a particular characteristic of the invention, the energy value is defined as being the sum of squares of wavelet coefficients of the at least one part weighted by a weight dependent on the sub-band and on the resolution level to which belongs the coefficient.

4. LIST OF FIGURES

Figure 2:
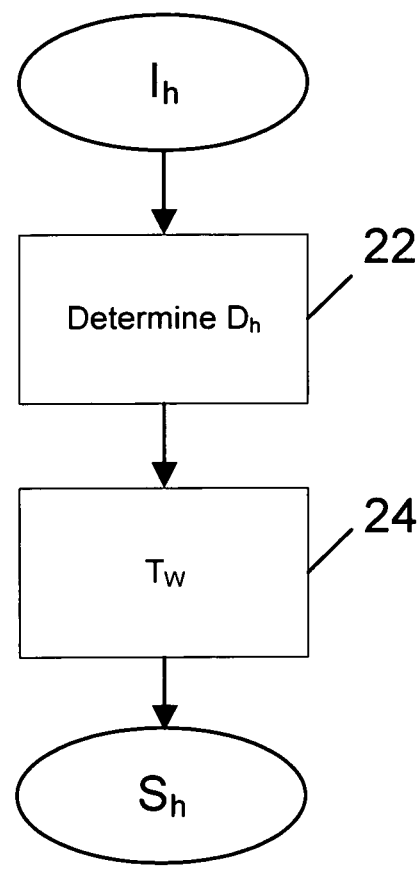
Figure 3:
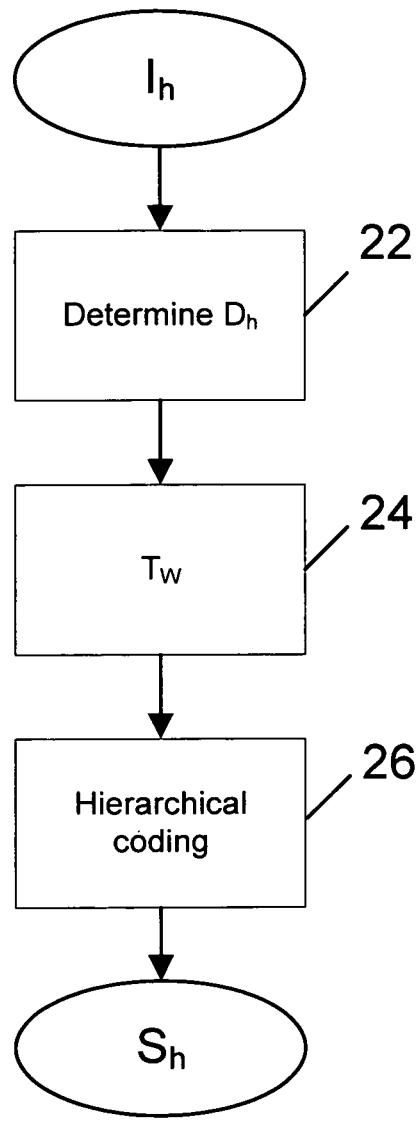

The invention will be better understood and illustrated by means of embodiments and advantageous implementations, by no means limiting, with reference to the figures in the appendix, wherein:
  FIG. 1 shows a registration method according to the invention,
  FIG. 2 shows a signature calculation method according to the invention, FIG. 3 shows a signature calculation method according to a variant of the invention, and FIGS. 4 to 7 show different variants of a registration device according to the invention.

5. DETAILED DESCRIPTION OF THE INVENTION

In reference to FIG. 1, the invention relates to a method for registration of a first sequence $Seq_1$ of N1 images $\{I_{t1}^1\}_{1 \leq t1 \leq N1}$ and a second sequence $Seq_2$ of N2 second images $\{I_{t2}^2\}_{1 \leq t2 \leq N2}$, where N1 and N2 are integers. With each of the first and second images is associated a signature, noted as $S_{t1}^1$ for a first image $I_{t1}^1$ respectively $S_{t2}^2$ for a second image $I_{t2}^2$. The set of signatures of first images forms a signature of the first sequence Seq1 and the set of signatures of second images form a signature of the second sequence Seq2.

During a step 10, first parts of signatures $\{S_{t1}^1\}_{1 \leq t1 \leq N1}$ of first images of seq1 are compared with corresponding parts of signatures $\{S_{t2}^2\}_{1 \leq t2 \leq N2}$ of second images of Seq2. The signatures $\{S_{t1}^1\}_{1 \leq t1 \leq N1}$ and $\{S_{t2}^2\}_{1 \leq t2 \leq N2}$ are all calculated according to the same method for calculation of signatures as for example that described in relation to FIG. 2. During this step of comparison 10, each image of the first sequence is compared with each image of the second sequence for example by calculating a distance between each signature pair, noted as $d(S_{t1}^1, S_{t2}^2)$. Note that, in this case, $S_{t1}^1$ and $S_{t2}^2$ refer to the first parts of signatures. Such a distance is small when the images $I_{t1}^1$ and $I_{t2}^2$ are visually close and great when they are visually very different. In the case where the signatures do not have the same length then the null coefficients are added in the shorter of the two signatures so that they have the same length as the longest of the two signatures. According to a particular embodiment, the distance $d(.,.)$ is the mean quadratic error calculated between the two signatures $S_{t1}^1$ and $S_{t2}^2$. According to a variant, this distance is the weighted sum of the mean quadratic error calculated between the two signatures $S_{t1}^1$ and $S_{t2}^2$ and an a priori term. The a priori term depends for example on the distances calculated between the image signatures that temporally precede the images $I_{t1}^1$ and $I_{t2}^2$. For example, the a priori term is the minimum distance among the following distances: $d(S_{t1}^1, S_{t2-1}^2)$, $d(S_{t1-1}^1, S_{t2-1}^2)$ and $d(S_{t1-1}^1, S_{t2}^2)$. According to a variant, more images that temporally precede the images and $I_{t1}^1$ and $I_{t2}^2$ are taken into account in the calculation of the a priori term. The a priori term enables account to be taken of the temporal neighbourhood of images to be registered.

During a step 12, each first image $I_{t1}^1$ is temporally registered with one of the second images $I_{t2}^2$ according to the result of the comparison step 10. For example, each image $I_{t1}^1$ is registered with the image $I_{t2}^2$ with which the distance calculated in step 10 is lowest.

According to a variant, the steps 10 and 12 are for example carried out by a dynamic programming type algorithm as described in the patent application WO2007045680 published Apr. 26, 2007 and also in the document "spatial temporal and histogram video registration for digital watermark detection", by Cheng H. et al published at ICIP in 2003 (vol. 2, pp 735-738).

In this case, the last image $I_{N1}^1$ of the first sequence is registered with the second image $I_{t2}^2$ for which the distance calculated in step 10 is lowest. The first images of the first sequence are then registered according to the dynamic programming algorithm in the inverse temporal order, the first image $I_1^1$ being registered last. For each registered image $I_{t1}^1$, the images that precede it temporally will be considered, and that which is the most probable will be determined, according to the distances calculated in step 10. One thus proceed step by step.

During a step 14, a value C representative of the registration quality is calculated for each first image. For example, this value is calculated comparing the following distances: $d(S_{t1}^1, S_{t2}^2)$, $d(S_{t1}^1, S_{t2-1}^2)$ and $d(S_{t1}^1, S_{t2+1}^2)$. If these three distances are very close then the registration quality is not good. More specifically, the probability is high of having a poor registration of the image $I_{t1}^1$. For example, $C=\min(|d(S_{t1}^1, S_{t2}^2)-d(S_{t1}^1, S_{t2-1}^2)|; |d(S_{t1}^1, S_{t2}^2)-d(S_{t1}^1, S_{t2+1}^2)|)$ During a step 16, for each first image for which the representative value of the registration quality is less than a threshold T, a first sub-sequence comprising this first image and the images of the first sequence Seq1 temporally surrounding this first image are defined as well as a second corresponding sub-sequence comprising the second image with which the first image was registered in step 12 and images of the second sequence Seq2 temporally surrounding this second image, During a step 18, for each first sub-sequence, second parts of signatures of first images of the first sub-sequence are compared with the corresponding parts of signatures of second images of the second corresponding sub-sequence. The second parts of signatures are different to first parts of signatures, for example they are disjointed or the second parts include the first parts and comprise additional coefficients. Step 18 is identical to step 10, except in operating on the sub-sequences Seq1 and Seq2 and on the second parts of signatures different to first parts of signatures.

During a step 20, each first image $I_{t1}^1$ of each first sub-sequence is temporally registered with one of the second images $I_{t2}^2$ of the second corresponding sub-sequence according to the result of the comparison step 18.

Steps 10 to 12 lead to a first registration that is more or less coarse but less costly in terms of CPU and memory. Steps 18 to 20 enable this registration to be improved on the sub-sequences, i.e. those for which the registration is insufficient.

According to a variant, the steps 14 to 20 are reiterated with other parts of first signatures and corresponding parts of second signatures until for each first image of the first sequence the value C representative of the quality of registration of this first image is greater than the threshold T.

According to another variant, the signatures of the first and/or second images are coded in binary form. According to this variant, the registration method comprises in addition before each of the comparison steps 10 and 18, a step of decoding parts of signatures of the first and/or the second images, the comparison steps 10 and 18 being applied on the parts of signatures of the first and/or second decoded image.

In reference to FIG. 2, the invention relates to a method for calculation of signatures for images of a sequence of images for registration of this sequence with another sequence of images.

During a step 22, a difference image $D_h$ is determined pixel by pixel between a current image and one of the images temporally surrounding the current image.

During a step 24, the difference image $D_h$ is transformed into wavelet coefficients, for example using a Haar or Daubechies transform.

According to a variant shown in FIG. 3, the method also comprises a step 26 of coding. During the step 26, at least one part of the wavelet coefficients are coded hierarchically. For example, a SPIHT (Set Partitioning in Hierarchical Trees) type or EZW (Embedded Zero-tree Wavelet) type coding algorithm. Such algorithms code the wavelet coefficients in hierarchical form such that the low frequency coefficients that represent the most important information are coded and thus transmitted first. As soon as the first bits are received, the decoding can begin and thus a coarse approximation of the difference image $D_h$ can be obtained. Such algorithms are thus used to represent a signature hierarchically in coded form. The part of coded wavelet coefficients is defined such that an energy level value or entropy of wavelet coefficients of this part is greater than a threshold value $E_T$. More specifically at each step of coding of new wavelet coefficients of a difference image $D_h$, the energy level or entropy of coded coefficients is calculated up to this instant and this energy level or entropy is compared with the threshold value $E_T$. If the energy level or entropy is less than $E_T$, then more wavelet coefficients are coded for this difference image $D_h$. The energy level is for example equal to the sum squared of wavelet coefficients. The entropy can be estimated by measuring the binary bitrate of coded coefficients.

According to a specific embodiment, the registration method described in reference to FIG. 1 is applied to signatures comprising wavelet coefficients calculated as described previously in reference to FIGS. 2 and 3. Advantageously, the first parts of the signature comprise low frequency wavelet coefficients and the second parts of signatures comprise higher frequency wavelet coefficients.

According to a variant, the wavelet coefficients are coded for at least one of the first and second sequences, i.e. for images of the sequence. The method for registration comprises, in addition, before each of the comparison steps, a step of decoding of signature parts, the comparison steps being applied on the decoded signature parts.

Figure 4:
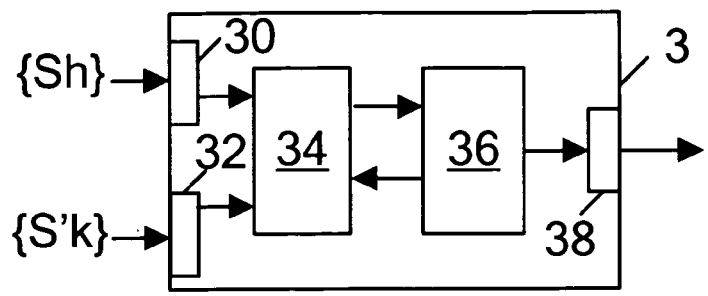

The invention also relates to a registration device 3 described in reference to FIG. 4. The registration device 3 comprises a first input 30 to receive the first signatures $\{S_{t1}^1\}_{1 \leq t1 \leq N1}$ and a second input 32 to receive the second signatures $\{S_{t2}^2\}_{1 \leq t2 \leq N2}$. It comprises connected to these inputs a registration module 34 able to implement the steps 10, 12, 16, 18 and 20 of the registration method according to the invention. It also comprises a module for calculation 36 of values representative of the registration quality. The calculation module 36 is able to implement step 14 of the registration method according to the invention and to inform the image registration module 34 for which there exists a doubt concerning the registration quality. The registration module 34 defines thus in accordance with step 16 the sub-sequences in order to operate the steps 18 and 20. It comprises moreover an output module 38.

Figure 5:
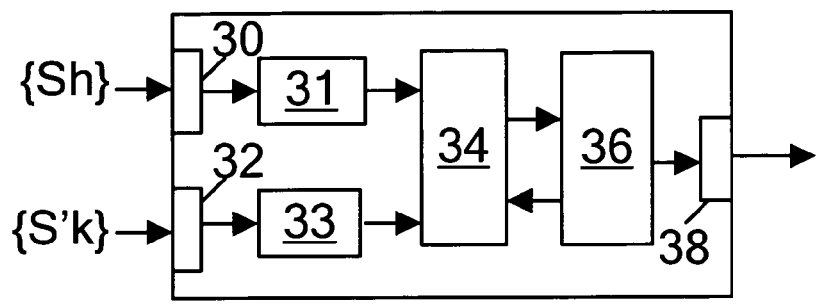

According to a first variant shown in FIG. 5, the registration device 3 also comprises signature decoding modules 31 and 32. According to this variant, the inputs 30 and 32 are able to receive first signatures $\{S_{t1}^1\}_{1 \leq t1 \leq N1}$ and second signatures $\{S_{t2}^2\}_{1 \leq t2 \leq N2}$ in coded form for example in accordance with step 26 of the signature calculation method described in reference to FIG. 3.

Figure 6:
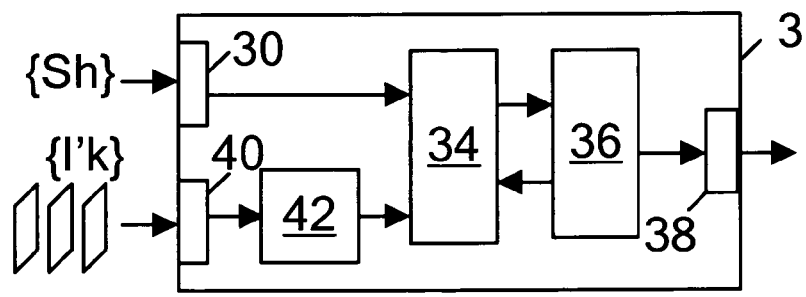

According to a second variant shown in FIG. 6, the registration device 3 comprises an input 40 instead of the input 32 to receive images $\{I_{t1}^1\}_{1 \leq t1 \leq N1}$. The registration device 3 also comprises a signature calculation module 42. This module is able to implement steps 22 and 24 of the signature calculation method described in reference to FIG. 2.

Figure 7:
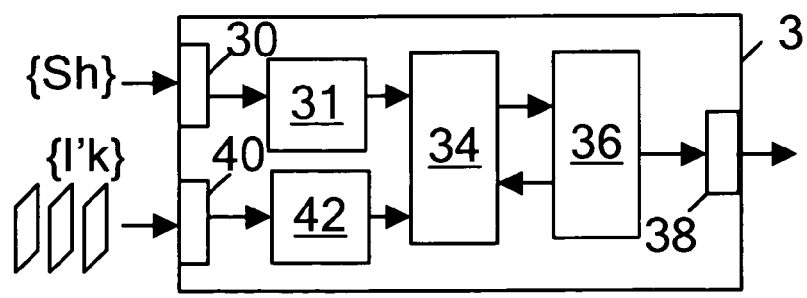

A third variant is shown in FIG. 7. This variant is a combination of the first and second variants. In this figure, the modules identical to the modules shown in FIGS. 5 and 6 are identified using the same numerical references.

Naturally, the invention is not limited to the embodiment examples mentioned above.

In particular, those skilled in the art may apply any variant to the stated embodiments and combine them to benefit from their various advantages. It can be directly generalised to any progressive coding diagram. Other coding types such as SVC can be used, conjointly with a bitrate allocation mechanism that guarantees that the information of greatest visual importance is coded in priority.

Advantageously the invention can be used to register a sequence of pirated images with a sequence of original images.

What is claimed is:

1. A method for temporal registration of a first sequence of first images and a second sequence of second images, to each of the first and second images being associated a signature, said method comprising the following steps:
   a) comparing first parts of signatures of said first images with corresponding parts of signatures of said second images, called the first comparison step,
   b) temporally registering each first image of said first sequence with one of the second images according to the result of said first comparison step,
   c) calculating for each first image a value representative of the registration quality of said first image,
   d) defining, for each first image for which the value representative of the registration quality is less than a threshold, a first sub-sequence comprising said first image and images of said first sequence temporally surrounding said first image and a second sub-sequence comprising the second image with which said first image is registered and images of the second sequence temporally surrounding said second image,
   e) comparing, for each first sub-sequence, second parts of signatures of said first images of said first sub-sequence with corresponding parts of signatures of said second images of said second corresponding sub-sequence, called the second comparison step, said second parts of signatures being different from said first parts of signatures, and
   (f) temporally registering each first image of said first sub-sequence with one of the second images of said second sub-sequence according to the result of said second comparison step.

2. A method according to claim 1, wherein the steps c) to f) are reiterated with other parts of said first signatures and corresponding parts of said second signatures until for each first image of said first sequence said value representative of the quality of registration of said first image is greater than said threshold.

3. A method according to claim 1, wherein said second parts comprise said first parts.

4. A method according to claim 1, wherein said second parts and said first parts are disjointed.

5. A method according to claim 1, wherein the first parts comprise low frequency wavelet coefficients and said second parts comprise high frequency wavelet coefficients.

6. A method according to claim 1, wherein said signatures comprise wavelet coefficients and wherein for at least one of said first and second sequences, said wavelet coefficients are coded, said method further comprises before each of said comparison steps, a step of decoding of said signature parts, said comparison steps being applied on decoded signature parts.

7. A method according to claim 1, wherein each of said signatures is calculated according to the following steps:
   determining a difference image pixel by pixel between the image with which the signature is associated, called current image, and one of the images temporally surrounding said current image,
   transforming said difference image into wavelet coefficients, and coding hierarchically at least one part of said wavelet coefficients.

8. A method according to claim 7, wherein said at least one part of said wavelet coefficients is defined in such a way that an energy value of wavelet coefficients of said at least one part is greater than a threshold value.

9. A method according to claim 8, wherein said energy value is defined as being the sum of squares of wavelet coefficients of said at least one part.

10. A method according to claim 8, wherein said energy value is defined as being the sum of squares of wavelet coefficients of said at least one part weighted by a weight dependent on the sub-band and on the resolution level to which belongs said coefficient.

11. A method according to claim 7, wherein said at least one part of said wavelet coefficients is defined in such a way that an entropy value of wavelet coefficients of said at least one part is greater than a threshold value.

12. A method according to claim 7, wherein the hierarchical coding step implements one of the coding methods belonging to a set of hierarchical coding methods comprising:
the coding method SPIHT, and
the coding method EZW.

* * * * *